(12) United States Patent
Koslow et al.

(10) Patent No.: US 11,502,224 B2
(45) Date of Patent: Nov. 15, 2022

(54) SEMICONDUCTOR BODY AND METHOD FOR PRODUCING A SEMICONDUCTOR BODY

(71) Applicant: OSRAM OLED GmbH, Regensburg (DE)

(72) Inventors: Ingrid Koslow, Regensburg (DE); Massimo Drago, Riedenburg (DE); Joachim Hertkorn, Woerth an der Donau (DE); Alexander Frey, Lappersdorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 28 days.

(21) Appl. No.: 16/624,911

(22) PCT Filed: Jun. 14, 2018

(86) PCT No.: PCT/EP2018/065861
§ 371 (c)(1),
(2) Date: Dec. 20, 2019

(87) PCT Pub. No.: WO2018/234159
PCT Pub. Date: Nov. 27, 2018

(65) Prior Publication Data
US 2021/0091267 A1    Mar. 25, 2021

(30) Foreign Application Priority Data

Jun. 21, 2017  (DE) .................... 10 2017 113 765.3
Sep. 15, 2017  (DE) .................... 10 2017 121 484.4

(51) Int. Cl.
*H01L 33/30*    (2010.01)
*H01L 31/0304*  (2006.01)
(Continued)

(52) U.S. Cl.
CPC ...... *H01L 33/305* (2013.01); *H01L 31/03042* (2013.01); *H01L 31/184* (2013.01); *H01L 33/0062* (2013.01)

(58) Field of Classification Search
CPC ............. H01L 33/305; H01L 31/03042; H01L 31/184; H01L 33/0062; H01L 33/04; H01L 33/025
See application file for complete search history.

(56) References Cited

U.S. PATENT DOCUMENTS

2002/0081763 A1   6/2002  Ishibashi et al.
2007/0290230 A1*  12/2007 Kawaguchi ............ B82Y 20/00
                                                  257/196

(Continued)

FOREIGN PATENT DOCUMENTS

CN    103650263 A    3/2014

OTHER PUBLICATIONS

International Search Report issued in the corresponding international patent application No. PCT/EP2018/065861 dated Sep. 11, 2018. 12 Pages, (referens purpose only).

(Continued)

*Primary Examiner* — Hoang-Quan Ho
(74) *Attorney, Agent, or Firm* — Viering Jentschura & Partner mbB

(57) ABSTRACT

A semiconductor body main include a III-V compound semiconductor material having a p-conductive region doped with a p-dopant. The p-conductive region may include at least one first section, one second section, and one third section. The second section may be arranged between the first and third sections. The second section may directly adjoin the first and third sections. An indium concentration of at least one of the sections differs from an indium concentration of the other two sections.

10 Claims, 6 Drawing Sheets

(51) Int. Cl.
  *H01L 33/00*   (2010.01)
  *H01L 31/18*   (2006.01)

(56) References Cited

U.S. PATENT DOCUMENTS

| 2010/0244063 A1* | 9/2010 | Yokogawa | H01L 33/007 |
| | | | 438/47 |
| 2013/0009202 A1 | 1/2013 | Enya et al. | |
| 2013/0016751 A1 | 1/2013 | Takado et al. | |
| 2013/0082273 A1* | 4/2013 | Ting | H01L 33/325 |
| | | | 257/76 |
| 2015/0263228 A1* | 9/2015 | Lee | H01L 33/325 |
| | | | 257/76 |

OTHER PUBLICATIONS

Search Report issued in the corresponding German patent application No. 102017121484.4 dated Jul. 10, 2018. 10 Pages, (referens purpose only).

Chinese Office Action issued for the corresponding CN patent application No. CN201880042056, dated Aug. 3, 2022, 8 pages (For informational purposes only).

\* cited by examiner

SEMICONDUCTOR BODY AND METHOD FOR PRODUCING A SEMICONDUCTOR BODY

CROSS-REFERENCE TO RELATED APPLICATIONS

The present application is a national stage entry according to 35 U.S.C. § 371 of PCT application No.: PCT/EP2018/065861 filed on Jun. 14, 2018; which claims priority to German Patent Application Serial No.: 10 2017 113 765.3 filed on Jun. 21, 2017 and German Patent Application Serial No. 10 2017 121 484.4 filed on Sep. 15, 2017; all of which are incorporated herein by reference in their entirety and for all purposes.

TECHNICAL FIELD

A semiconductor body is provided. A method for producing a semiconductor body is furthermore provided.

BACKGROUND

An object to be achieved is, inter alia, to provide a semiconductor body which has improved electrical and/or optical properties. A further object to be achieved is to provide a method for producing such a semiconductor body.

SUMMARY

The semiconductor body is, for example, a part of an electronic or optoelectronic component. For example, the optoelectronic component which is formed with the semiconductor body is a radiation-emitting or radiation-detecting component, for example a light-emitting diode chip or a laser diode chip. In particular, the semiconductor body may be adapted to emit or detect electromagnetic radiation during intended operation.

For example, the semiconductor body is formed with a semiconductor material. In particular, the semiconductor body may consist of semiconductor material. The semiconductor body may be formed with regions which have different doping.

According to at least one embodiment, the semiconductor body includes a III-V compound semiconductor material. For example, the semiconductor body is based on a nitride compound semiconductor material. In the present context, "based on a nitride compound semiconductor material" means that the semiconductor layer sequence or at least a part thereof, such as at least one active region, includes or consists of a nitride compound semiconductor material, such as $Al_nGa_mIn_{1-n-m}N$, where $0 \leq n \leq 1$, $0 \leq m \leq 1$ and $n+m \leq 1$. In this case, this material need not necessarily have a mathematically exact composition according to the formula above. Rather, it may for example include one or more dopants as well as additional constituents. For the sake of simplicity, however, the formula above only contains the essential constituents of the crystal lattice (Al, Ga, In, N), even though these may be partially replaced and/or supplemented with small amounts of other materials.

According to at least one embodiment, the semiconductor body includes a p-conductive region, which is doped with a p-dopant. For example, the p-dopant produces defects in the compound semiconductor material of the semiconductor body and modifies properties, in particular electrical and/or optical properties, of the semiconductor body. The p-dopant is a dopant which functions as an electron acceptor inside the semiconductor body. For example, the p-dopant includes magnesium or consists of magnesium.

According to at least one embodiment, the p-conductive region includes at least one first, one second and one third section. In particular, the p-conductive region may include a plurality of first, a plurality of second and a plurality of third sections. The sections differ, for example, by their material composition. The sections extend in lateral directions along the main extent plane of the semiconductor body. In particular, the sections may be congruent with one another perpendicularly to the lateral direction. For example, each section extends perpendicularly to the lateral direction over the entire cross-sectional area of the semiconductor body. Each section then includes at least one layer of the semiconductor body. The layers of the semiconductor body are, for example, epitaxially deposited above one another and stacked above one another along the growth direction.

According to at least one embodiment of the semiconductor body, the second section is arranged between the first and the third sections. For example, the first section and the third section are not in direct contact with one another, but are separated from one another at least by the second section.

According to at least one embodiment, the second section is directly adjacent to the first and the third sections. For example, the second section is in direct contact with the third section and/or the first section. The second section may be connected with a material fit to the third and/or first section. For example, the first and/or the third section are connected to one another with a material fit by means of intermolecular bonding forces. In particular, the sections can be detached from one another only with at least partial destruction of one of the sections.

According to at least one embodiment, the indium concentration of at least one of the sections is different to the indium concentrations of the other two sections. For example, one of the sections has a higher indium concentration than the other two sections. As an alternative, one of the sections has a lower indium concentration than the other two sections. For example, in one of the sections the indium concentration is at least ten times higher or at least ten times lower, in particular at least 100 times higher or at least 100 times lower, than in the other two sections. In this case, it is possible in particular for all the sections to have an indium concentration greater than zero. This then means that all the sections contain indium.

According to at least one embodiment, the semiconductor body includes a III-V compound semiconductor material having a p-conductive region, which is doped with a p-dopant, wherein the p-conductive region includes at least one first, one second and one third section, the second section is arranged between the first and the third sections, the second section is directly adjacent to the first section and the third section, and the indium concentration of at least one of the sections is different to the indium concentrations of the other two sections.

A semiconductor body as described here is in this case, inter alia, based on the following considerations. In order to adapt the optical and/or electrical properties of a p-conductive material of a semiconductor body in a controlled way inside individual sections of a p-conductive region, different concentrations of a p-dopant are required in the sections.

The semiconductor body described here now makes use, inter alia, of the idea of influencing the concentration of a p-dopant inside a p-conductive region of a semiconductor body by means of the addition of indium. In this case, it has surprisingly been found that, in sections in which the semiconductor body has an increased indium concentration, it has an increased acceptance for incorporation of the p-dopant, in particular magnesium. In particular, segregation of p-dopant atoms on the surface of the semiconductor body during the epitaxial growth of the semiconductor body is reduced by means of an increased concentration of indium in the semiconductor body, since otherwise segregated p-dopant atoms are integrated better into the semiconductor body. Advantageously, this allows particularly high rates of change of the concentration of the p-dopant along the growth direction of the semiconductor body.

According to at least one embodiment, the first, the second and the third sections have different concentrations of the p-dopant, the second section having a higher concentration of the p-dopant than the first section, and the second section having a higher indium concentration than the first section. For example, the indium concentration and/or the concentration of the p-dopant varies transversely to the main extent direction of the semiconductor body. In particular, the indium concentration and/or the concentration of the p-dopant may be constant along the main extent direction of a section within a tolerance range of for example at most 5% relative, in particular at most 1% relative.

For example, the second section may have a concentration of the p-dopant of at least $2\times10^{19}$ atoms per cm$^3$. Furthermore, the second section may have an indium concentration of at least $1\times10^{18}$ atoms per cm$^3$. In particular, the semiconductor body may include at least 5% indium in the second section. The first section may, for example, have a concentration of the p-dopant of at most $2\times10^{19}$ atoms per cm$^3$. In particular, the first section may have an indium concentration of at most $1\times10^{17}$ atoms per cm$^3$. For example, the semiconductor body may include at most 1% indium in the first section. Advantageously, by means of the increased indium concentration in the second section, the magnesium concentration in the section with the increased indium concentration may be adjusted with a particularly high rate of change along the growth direction of the section.

According to at least one embodiment, the first, the second and the third sections have different concentrations of the p-dopant, the second section having a higher indium concentration than the first section, and the second section having a higher concentration of the p-dopant than the third section. For example, the second section has an indium concentration of at least $1\times10^{18}$ atoms per cm$^3$ and/or the first section has an indium concentration of at most $1\times10^{17}$ indium atoms per cm$^3$. Furthermore, for example, the second section has a concentration of the p-dopant of at least $2\times10^{19}$ atoms per cm$^3$, and the third section has a concentration of the p-dopant of at most $2\times10^{19}$ atoms per cm$^3$. Advantageously, the increased indium concentration in the second section allows a particularly high rate of change of the concentration of the p-dopant at the transition from the second section to the third section. In particular, the increased indium concentration reduces accumulation of p-dopant atoms on the surface of the semiconductor body during the epitaxial growth of the second section.

According to at least one embodiment, the concentration of the p-dopant in the second section has a local maximum. For example, the concentration of the p-dopant in the second section initially increases in the direction of the third section. Furthermore, the concentration of the p-dopant in the second section may decrease in the direction of the third section. In particular, the concentration of the p-dopant in the second section has a greater value than the concentration of the p-dopant in the first section. For example, the concentration of the p-dopant in the second section decreases in the direction of the third section to below the concentration of the p-dopant in the first section. In particular, the concentration of the p-dopant in the second section may be higher than in the first and third sections. Advantageously, the maximum of the concentration of the p-dopant inside the semiconductor body may be deliberately arranged inside a predeterminable region by means of changing the indium concentration in the semiconductor body.

According to at least one embodiment, the concentration of the p-dopant in the p-conductive region has a rate of change of at least $\pm 1\times10^{20}$ atoms per cm$^3$ per μm, such as at least $\pm 1\times10^{21}$ atoms per cm$^3$ per μm, perpendicularly to the main extent plane of the first, second and third sections. In particular, the p-conductive region has a rate of change of the p-dopant of at least $\pm 2\times10^{21}$ atoms per cm$^3$ per μm only in sections in which the indium concentration is at least $1\times10^{18}$ atoms per cm$^3$. For example, at a transition in the growth direction from a first section to a second section, the first section having a lower maximum concentration of the p-dopant than the second section, the concentration of the p-dopant increases in magnitude with a maximum rate of change of at least $2\times10^{21}$ atoms per cm$^3$ per μm, in particular with a maximum rate of change of at least $4\times10^{21}$ atoms per cm$^3$ per μm. For example, at a transition in the growth direction from a first section to a second section, the first section having a higher maximum concentration of the p-dopant than the second section, the concentration of the p-dopant decreases in magnitude with a maximum rate of change of at least $1\times10^{20}$ atoms per cm$^3$ per μm, in particular at least $2\times10^{21}$ atoms per cm$^3$ per μm. Advantageously, this particularly high rate of change of the concentration of the p-dopant allows particularly exact adjustment of the optical and/or electronic properties of the p-conductive region.

According to at least one embodiment, the semiconductor body includes an active region. The p-conductive region according to the embodiment furthermore includes an electron blocking layer, the electron blocking layer being present on a side of the p-conductive region facing toward the active region, and the first section and/or the second section lying at least partially inside the electron blocking layer, the second section having a greater maximum indium concentration than the first section adjacent to the active region and the third section adjacent to the second section, and the first and/or second section having a higher concentration of the p-dopant than the active region adjacent to the electron blocking layer and the third section adjacent to the second section. For example, the active region is adapted to generate electromagnetic radiation during intended operation. In particular, the active region includes a multiplicity of quantum well structures. The electron blocking layer may be formed adjacent to the active region. For example, a first and a second section may be formed in the electron blocking layer. In particular, the first section may lie fully inside the electron blocking layer. Furthermore, the second section may lie fully inside the electron blocking layer. Furthermore, a third section may be formed on a side of the electron blocking layer facing away from the active region, in particular directly adjacent to the electron blocking layer.

The electron blocking layer may, for example, be adapted to limit the spatial spreading of electrons inside the semiconductor body during intended operation. For example, the electron blocking layer has a particularly high concentration of the p-dopant. In particular, the electron blocking layer has a concentration of at least $1\times10^{19}$ atoms per cm$^3$ of the p-dopant. In particular, the first section is arranged between the second section and the active region. The first section may for example have a thickness of at most 200 nm, in particular at most 50 nm. In a non-limiting embodiment, the first section has a thickness of at most 30 nm, in particular at most 5 nm.

For example, the concentration of the p-dopant decreases, starting from the second section in the direction of the third section, with a magnitude rate of change of at least $1 \times 10^{21}$ atoms per cm$^3$ per µm, in particular at least $2 \times 10^{21}$ atoms per cm$^3$ per µm. For example, the direction of the change may be parallel to a growth direction, along which the layers of the semiconductor body are epitaxially deposited above one another. In particular, the concentration of the p-dopant in the third section is at most $2 \times 10^{19}$ atoms per cm$^3$. Advantageously, an electron blocking layer which has a high concentration of the p-dopant makes it possible to block electrons coming from the active region, so that they do not pass through the p-conductive region. Furthermore, a low concentration of the p-dopant in the third section allows particularly good optical properties, so that a particularly low proportion of the electromagnetic radiation generated in the active region during intended operation is absorbed inside the p-conductive region.

According to at least one embodiment, the semiconductor body includes an active region. Furthermore, the p-conductive region according to the embodiment includes a p-contact layer, the p-contact layer being present on a side of the p-conductive region facing away from the active region, and the second section lying at least partially inside the p-contact layer, the second section having a greater indium concentration than the first section adjacent to the second section. For example, the second and/or the third section may lie fully in the p-contact layer. Furthermore, for example, the first section may be formed in a region of the semiconductor body adjacent to the p-contact layer. The p-contact layer may, for example, be adapted to be electrically conductively contacted via an outer surface of the semiconductor body. In particular the p-contact layer is adapted to form a low-ohmic region with a resistivity of at most $$1 \times 10^{-7} \frac{\Omega}{m}$$

in the semiconductor body.

For example, the second section has a maximum concentration of the p-dopant of at least $1 \times 10^{19}$ atoms per cm$^3$. Furthermore, the p-contact layer, in particular the second section, may have an indium concentration which is at least $1 \times 10^{18}$ atoms per cm$^3$, such as at least $1 \times 10^{19}$ atoms per cm$^3$. The second section may, for example, have a higher maximum concentration of the p-dopant than the first section. For example, the maximum concentration of the p-dopant in the second section is at least ten times the maximum concentration of the p-dopant in the first section. In particular, the maximum rate of change of the dopant concentration in the first and/or second section in the direction of the third section is at least $+1 \times 10^{21}$ atoms per cm$^3$ per µm.

Furthermore, for example, the third section forms an outer surface of the p-conductive region facing away from the semiconductor body. In particular, the concentration of the p-dopant in the second section may be at most ten times the concentration of the p-dopant in the third section. Advantageously, a doping profile, perpendicular to the main extent plane of the p-conductive region, which has a particularly high rate of change of the p-dopant, allows a particularly thin p-contact layer. In this case, the p-contact layer has a high conductivity for positive charge carriers and a low absorption for electromagnetic radiation generated in the active region.

A method for producing a semiconductor body is furthermore provided. With the method, a semiconductor body as described here may in particular be produced. That means that all features disclosed for the semiconductor body are also disclosed for the method, and vice versa.

The method for producing a semiconductor body is, for example, an epitaxy method. In particular, during the epitaxy method, semiconductor material is deposited on a carrier which is arranged in a process chamber. By means of the epitaxy method, for example, a plurality of layers of semiconductor materials with different compositions may be deposited on one another. The composition of the layers may, for example, be adjusted by means of the flow rates of the process gases and/or process liquids supplied. The semiconductor materials may for example be III-V compound semiconductor materials, in particular nitride compound semiconductor materials.

According to at least one embodiment of the method for producing a semiconductor body, a p-conductive region having at least one first, one second and one third section is epitaxially grown. The p-conductive region may include a p-dopant, for example magnesium. In particular, the entire p-conductive region is epitaxially grown. The first, second and third sections may, for example, have a different material composition. For example, the first, the second and/or the third sections differ in the concentration of the p-dopant.

According to at least one embodiment, the first section is grown during a first time period, the second section is grown during a second time period and the third section is grown during a third time period. In this case, the second time period lies chronologically between the first and the third time periods. For example, the second time period directly follows the first time period. In particular, the third time period directly follows the second time period. The first, the second and/or the third time periods may, for example, have a different duration. Furthermore, different amounts of the semiconductor material may be deposited during the first, second and third time period. In particular, the first section, the second section and/or the third section have a different thickness along the growth direction.

According to at least one embodiment of the method for producing a semiconductor body, a different indium flow rate is adjusted during one of the time periods than during the other two time periods. In particular, a different indium flow rate may be adjusted relative to further process gases or absolutely. For example, the indium flow rate is an amount of a gas containing indium, or a liquid containing indium, which is supplied to a process chamber per unit time. In particular, the process gas is trimethylindium (TMIn).

In this case, the indium supplied is at least partially epitaxially deposited, so that it forms a semiconductor body. For example, a higher indium flow rate is adjusted during the first time period than during the second and/or third time period. As an alternative, a higher indium flow rate may be adjusted during the second time period than during the first and/or third time period. In particular a higher indium flow rate may be adjusted during the third time period than during the first and/or second time period. In particular, the indium concentration of a section which is deposited during this time period may be increased by means of an increased indium flow rate.

Advantageously, the indium concentration in individual sections of the p-conductive region may be adapted by means of an increased indium flow rate so that the semiconductor body has predeterminable properties in these regions. For example, incorporation of the p-dopant is improved in regions with an increased indium concentration, so that an increased concentration of the p-dopant is possible in these regions. Furthermore, the improved incorporation of the p-dopant due to the increased indium concentration allows particularly exact adjustment of the concentration of the p-dopant in the semiconductor body.

According to at least one embodiment of the method for producing a semiconductor body, a higher flow rate of a p-dopant and a higher indium flow rate are adjusted during the second time period than during the first time period. For example, the p-dopant is magnesium. In particular, the magnesium may be supplied to a process chamber in a compound. For example, the p-dopant is supplied to the process chamber in the form of bis(cyclopentadienyl)magnesium ($Cp_2Mg$). For example, the flow rate of the p-dopant is adjusted in such a way that during the second time period the concentration of the p-dopant is at least five times, in particular at least ten times, higher than in the section which is grown during the respective time period. Advantageously, a high indium flow rate and a high flow rate of the p-dopant allow a high rate of change of the concentration of the p-dopant along the growth direction of the semiconductor body.

According to at least one embodiment of the method for producing a semiconductor body, a lower indium flow rate is adjusted during the third time period than during the second time period, and an at least equally high flow rate of the p-dopant is adjusted during the third time period as during the second time period. For example, the duration of the second time period is adjusted as a function of the concentration of the p-dopant in the second section, grown during the second time period, of the p-conductive region. For example, the second time period is ended as soon as a predetermined concentration of the p-dopant in the second section is reached.

In particular, in order to achieve a high rate of change of the concentration of the p-dopant along the growth direction in a section, the indium flow rate can be increased during time periods during which the section is epitaxially deposited. For example, the rate of change in a section is at least $3\times10^{21}$ atoms per $cm^3$ per µm. Advantageously, increasing the indium flow rate allows an increased rate of change of the concentration of the p-dopant inside a section. In particular, the indium flow may be reduced when a desired concentration of the p-dopant inside the semiconductor body is reached. In particular, the increased indium flow is not necessary in order to obtain a concentration of the p-dopant once it has been reached. Advantageously, the amount of the p-dopant which accumulates on the surface of the semiconductor body increases only slowly while the indium flow rate is reduced. A constant concentration of the p-dopant in the respective section of the p-conductive region may therefore be adjusted during the epitaxy method.

According to at least one embodiment of the method for producing a semiconductor body, a higher indium flow rate is adjusted during the second time period than during the first time period, and a lower flow rate of the p-dopant is adjusted during the second time period than during the first time period. For example, the indium flow rate is increased until the concentration of the p-dopant on the surface of the section grown during the second time period has fallen below a predetermined limit value. For example, the second time period is ended when the concentration of the p-dopant has fallen below this predetermined value. For example, the predetermined limit value is a concentration of the p-dopant of $2\times10^{19}$ atoms per $cm^3$, in particular $1\times10^{19}$ atoms per $cm^3$.

According to at least one embodiment of the method for producing a semiconductor body, a flow rate of the p-dopant of 0 liters per second is adjusted during the second time period. In particular, no p-dopant is supplied during the second time period. Advantageously, the increased indium flow rate during the second time period allows increased incorporation of p-dopant atoms in the second section of the semiconductor body. The combination of the increased indium flow rate during the second time period and the flow rate of the p-dopant of 0 liters per second during the second time period allows a particularly high rate of change of the p-dopant inside the second section in the growth direction of the semiconductor body.

According to at least one embodiment, the p-dopant includes magnesium or is magnesium. In particular, the p-dopant is adapted to function as an electron acceptor in a III-V compound semiconductor material. Advantageously, the electrical and/or optical properties of the semiconductor body may be adapted specifically in individual sections by means of concentration changes of the p-dopant.

BRIEF DESCRIPTION OF THE DRAWINGS

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

Elements which are the same or of the same type, or which have the same effect, are provided with the same references in the figures. The figures and the size ratios of the elements represented in the figures with respect to one another are not to be regarded as true to scale, unless units are explicitly given. Rather, some elements may be represented exaggeratedly large for better representability and/or for better understanding.

DETAILED DESCRIPTION

Figure 1A:
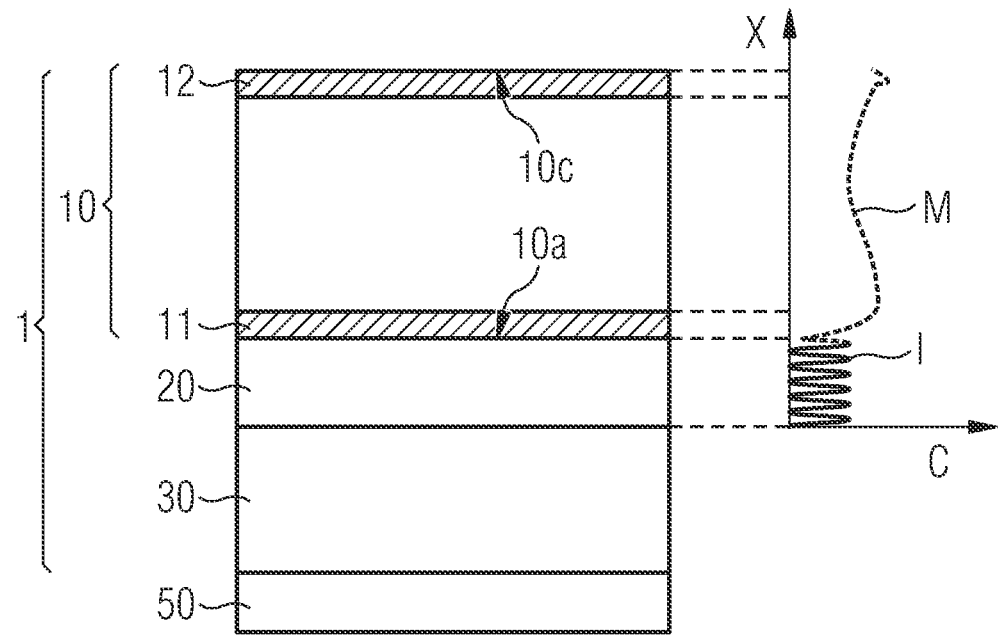
FIGS. 1A, 1B and 1C show sectional views of a semiconductor body as described here and a profile of the magnesium and indium concentrations inside the active region and the p-conductive region.

FIG. 1A shows a schematic sectional representation of a semiconductor body 1 as described here according to a first exemplary embodiment. The semiconductor body 1 is epitaxially grown on a carrier 50. The semiconductor body includes an n-conductive region 30, an active region 20 and a p-conductive region 10. For example, the semiconductor body is formed with a compound semiconductor material, in particular a III-V compound semiconductor material, for example a nitride compound semiconductor material. For example, the semiconductor body is adapted to emit electromagnetic radiation during intended operation.

The p-conductive region 10 includes an electron blocking layer 11 on a side 10a facing toward the active region 20. The electron blocking layer 11 is, for example, adapted to reduce or prevent an electron flow from the active region into the p-conductive region during intended operation. Furthermore, the p-conductive region 10 includes a p-contact layer 12 on its side 10c facing away from the active region 20. The p-contact layer 12 is adapted, during intended operation, to be electrically conductively contacted and conduct positive charge carriers in the direction of the active region 20.

Furthermore, FIG. 1A shows a graph in which the concentration C of indium I and of a p-dopant M is plotted along the growth direction X of the p-conductive region 10 and of the active region 20. The graph shows that indium is nominally present only in the active region 20. Furthermore, the semiconductor body 1 has a particularly high concentration M of the p-dopant in the region of the electron blocking layer 11 and in the region of the p-contact layer 12. In particular, the concentration of the p-dopant M has local maxima in the region of the electron blocking layer 11 and of the p-contact layer 12. The electron blocking layer 11 is present on a side of the p-conductive region 10 facing toward the active region 20. The first section (shown in FIG. 1B) and/or the second section (shown in FIG. 1B) lie at least partially inside the electron blocking layer 11, the second section having a greater maximum indium concentration I than the first section adjacent to the active region 20 and the third section (shown in FIG. 1B) adjacent to the second section. For example, the first section has a maximum thickness of 30 nm, in particular at most 5 nm.

Figure 1B:
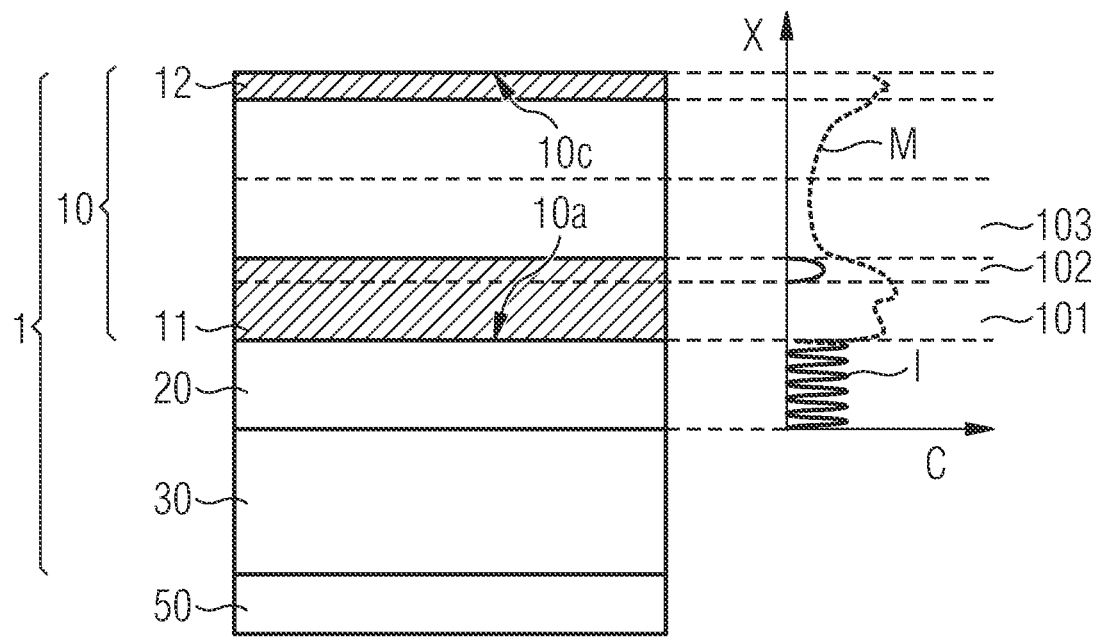

FIG. 1B shows a schematic sectional representation of a semiconductor body 1 as described here according to a second exemplary embodiment. The semiconductor body 1 differs from the semiconductor body 1 represented in FIG. 1A by the concentration of the p-dopant M and of indium I inside the p-conductive region 10. The p-conductive region 10 includes a first section 101, a second section 102 and a third section 103. The second section 102 is directly adjacent to the first 101 and the third 103 sections. The indium concentration I of the second section 102 is different to the indium concentration I of the first section 101 and of the third section 103. Furthermore, the first 101, the second 102 and the third 103 sections have different concentrations M of the p-dopant. For example, the p-dopant includes magnesium, and in particular the p-dopant is magnesium.

Furthermore, the second section 102 has a higher indium concentration than the first section 101 and the second section 102 has a higher concentration M of the p-dopant than the third section 103. In particular, the p-conductive region 10 has a lower minimum concentration of the p-dopant M in the third section 103 than the semiconductor body 1 represented in FIG. 1A. Furthermore, the concentration of the p-dopant decreases at the transition from the second region 102 to the third region 103 in the growth direction X at least with a maximum magnitude rate of change of $1 \times 10^{21}$ atoms per cm³ per µm.

The first section and/or the second section lie at least partially inside the electron blocking layer, the second section having a greater maximum indium concentration than the first section adjacent to the active region and the third section adjacent to the second section. Furthermore, the first and/or second section has a higher concentration of the p-dopant than the active region adjacent to the electron blocking layer and the third section adjacent to the second section.

Figure 1C:
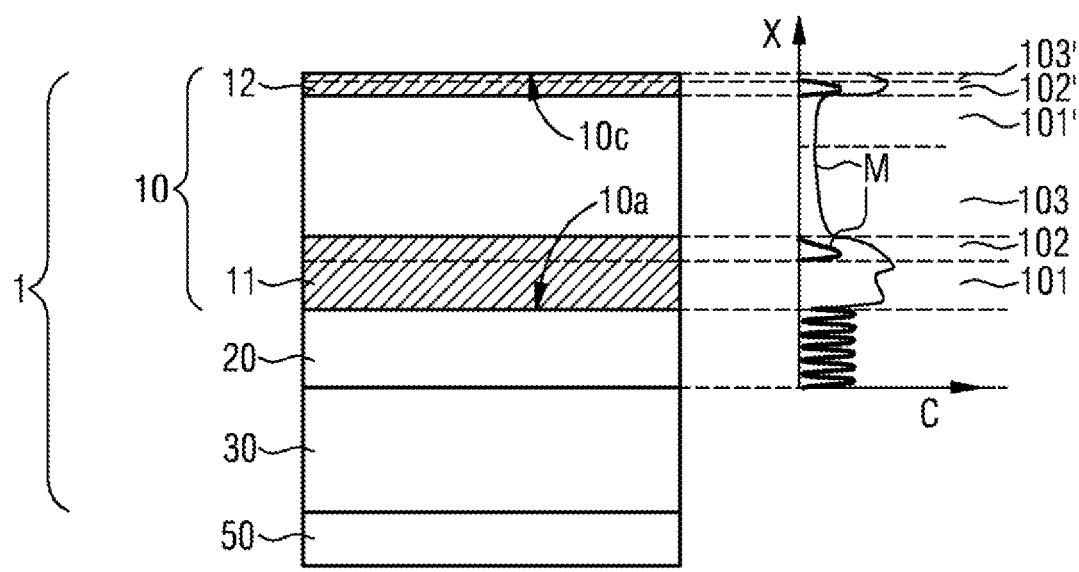

FIG. 1C shows a schematic sectional representation of a semiconductor body 1 as described here according to a third exemplary embodiment. In contrast to the first and the second exemplary embodiments, the semiconductor body 1 has a different concentration of indium I and of the p-dopant M in the p-conductive region 10. The p-conductive region 10 includes a further first 101', a further second 102' and a further third 103' section, which are arranged next to one another in the growth direction X. The further second 102' and/or further third 103' section are at least partially arranged in the region of the p-contact layer 12. In particular, the further second section 102' has a higher concentration M of the p-dopant than the first further section 101'. Furthermore, the further second section 102' has a higher indium concentration I than the further first section 101'. For example, the magnesium concentration M increases with a rate of change of at least $3 \times 10^{21}$ atoms per cm³ per µm in the further first 101' and/or further second 102' section along the growth direction X. In particular, the rate of change is not constant. For example, the rate of change of the concentration of the p-dopant along the growth direction has a maximum value which is at least $3 \times 10^{21}$ atoms per cm³ per µm.

Figure 2:
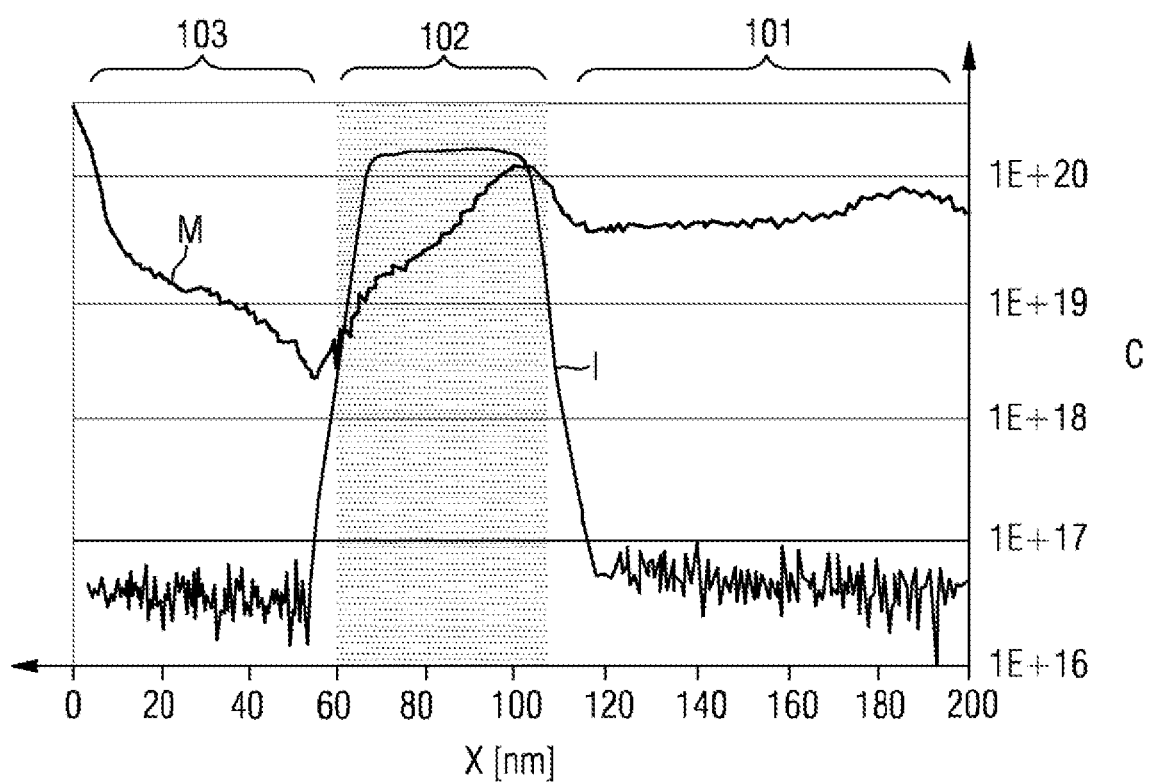
FIGS. 2, 3A and 3B show the indium concentration and the concentration of a p-dopant in a first, second and third section of a semiconductor body.

FIG. 2 shows a graph in which a concentration C of indium I and of a p-dopant M in a first 101, a second 102 and a third 103 section along the growth direction X are represented. In the first section 101, the concentration of the p-dopant M is between $8 \times 10^{19}$ and $3 \times 10^{19}$ atoms per cm³. The indium concentration I in the first section 101 is less than $1 \times 10^{17}$ atoms per cm³. In the growth direction X, the indium concentration I increases from the first section 101 in the direction of the second section 102. In particular, the indium concentration I in the region of the second section 102 is greater than $1 \times 10^{18}$ atoms per cm³. In the region in which the indium concentration I has an increase from $1 \times 10^{18}$ atoms per cm³ to more than $1 \times 10^{20}$ atoms per cm³, the magnesium concentration M increases from $3 \times 10^{19}$ atoms per cm³ to $1 \times 10^{20}$ atoms per cm³. For example, the indium concentration I is at least $1 \times 10^{18}$ atoms per cm³ in the entire second section 102.

Inside the second section 102, the concentration of the p-dopant M decreases from a concentration of $1 \times 10^{20}$ atoms per cm³ to a concentration of less than $3 \times 10^{18}$ atoms per cm³. In particular, the flow rate of the p-dopant is 0 liters per second during the epitaxial growth of the entire second section 102. Nevertheless, the magnesium concentration in the second section 102 initially increases in the growth direction X, since the incorporation of magnesium into the p-conductive region 10 is assisted by means of the increased indium concentration I. Therefore, p-dopant, in particular magnesium, which has accumulated on the surface of the semiconductor body 1 during the epitaxial growth is initially taken up into the region of the semiconductor body 1 grown during this time period. Since no further p-dopant is supplied to the process chamber during the growth of the second section 102, the concentration of the p-dopant decreases in the second section 102.

Adjacent to the second section 102 is the third section 103, in which the indium concentration I is less than $1 \times 10^{17}$ atoms per cm³. In the third section 103, the concentration of the p-dopant M increases in the growth direction X. In particular, p-dopant has been supplied to the process chamber during the epitaxial growth of the third section 103.

In particular, the indium concentration may be specified in units different to the Y axis. For example, the indium concentration in the first section 101 and in the third section 103 is at most 0.01%. Furthermore, the indium concentration in the second section 102 is at least 2.5%, such as at least 3%.

Figure 3A:
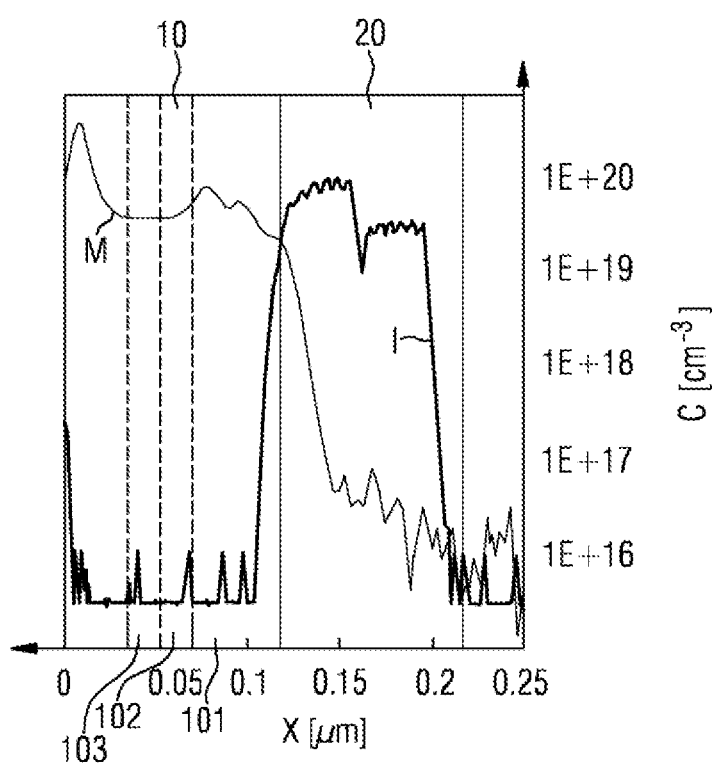

FIG. 3A shows a profile of an indium concentration I and of a concentration of the p-dopant M inside a p-conductive region 10 and an active region 20 of a semiconductor body 1. The concentration of the p-dopant M in the p-conductive region 10 is between $3\times10^{19}$ and $3\times10^{20}$ atoms per cm$^3$. The indium concentration I in the p-conductive region 10 is substantially less than $1\times10^{17}$ atoms per cm$^3$.

In a first section 101, the concentration of the p-dopant M increases to a value of about $8\times10^{19}$ atoms per cm$^3$. In a second section 102, the concentration of the p-dopant M decreases to a value of $3\times10^{19}$ atoms per cm$^3$. In the entire p-conductive region 10, the concentration of the p-dopant M is at least $3\times10^{19}$ atoms per cm$^3$. In the first 101, second 102 and in the third 103 sections, the indium concentration I is less than $1\times10^{16}$ atoms per cm$^3$.

Figure 3B:
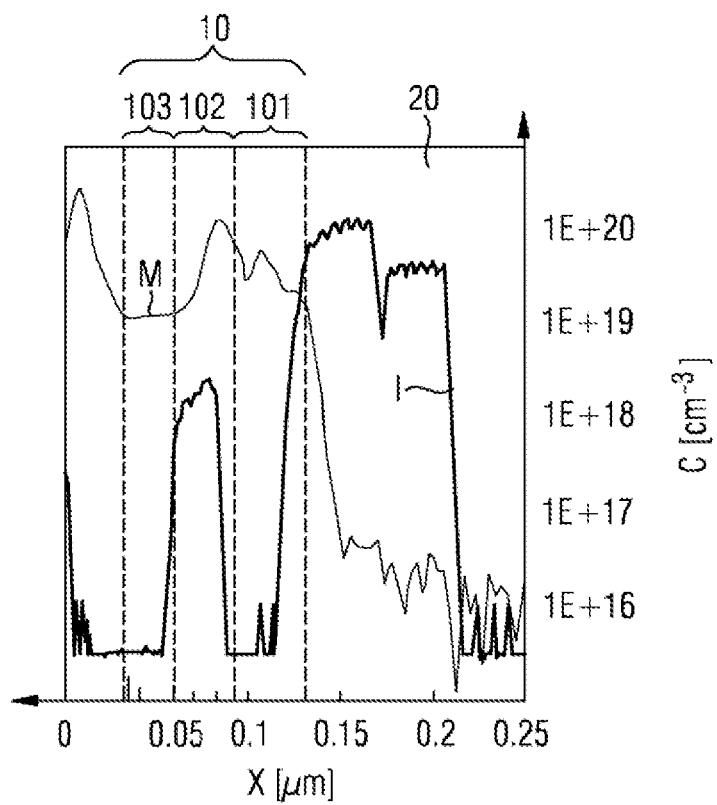

FIG. 3B shows the concentration of the p-dopant M and of indium I in a p-conductive region 10 and an active region 20. In contrast to the exemplary embodiment represented in FIG. 3A, in the p-conductive region 10 the incorporation of the p-dopant M is adapted in sections by means of the addition of indium I. In the second section 102, the indium concentration I is increased in relation to the first 101 and the third 103 sections. In particular, the indium concentration I in the second section 102 is at least $1\times10^{18}$ atoms per cm$^3$. In the first section 101, the concentration of the p-dopant is at most $5\times10^{19}$ atoms per cm$^3$. In the growth direction X, the magnesium concentration initially increases in the second section. Subsequently, the concentration of the p-dopant M decreases in the growth direction X from more than $9\times10^{19}$ atoms per cm$^3$ to less than $2\times10^{19}$ atoms per cm$^3$. For example, the maximum rate of change of the concentration of the p-dopant in the growth direction X is at least $3\times10^{21}$ atoms per cm$^3$ per µm.

During the epitaxial growth of the second 102 and third 103 sections, nominally no p-dopant M is supplied to the process chamber. The fact that the concentration of the p-dopant M initially increases in the growth direction in the second section is attributable to the fact that the incorporation of the p-dopant, in particular magnesium, into the semiconductor body is improved by means of the increased indium concentration I. In a third section 103 adjacent to the second section 102, the indium concentration I is at most $1\times10^{17}$ atoms per cm$^3$. In the third section 103, the magnesium concentration M is at most $2\times10^{19}$ atoms per cm$^3$. In particular, the concentration of the p-dopant in the second section 102 has a local maximum.

In particular, the indium concentration may be specified in units different to the Y axis. For example, the indium concentration in the first section 101 and in the third section 103 is at most 0.01%. Furthermore, the indium concentration in the second section 102 is at least 0.1%, such as at least 0.5%.

Figure 4A:
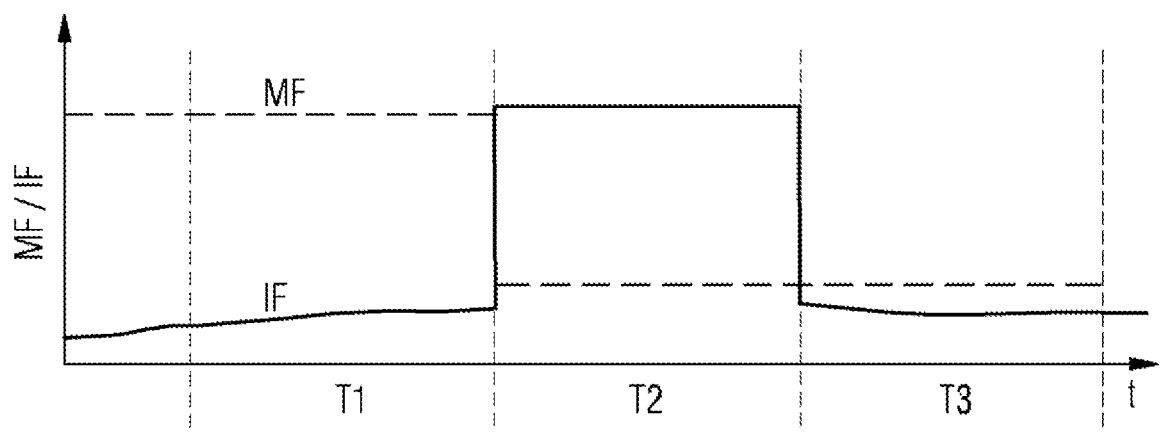
FIGS. 4A and 5A show indium and p-dopant flow rates during a method for producing a semiconductor body.

FIG. 4A shows the flow rate of indium IF and the flow rate of the p-dopant MF during the epitaxial growth of a first section 101 during a first time period T1, of a second section 102 during a second time period T2 and of a third section 103 during a third time period T3. The second time period T2 lies chronologically between the first T1 and the third T3 time periods. For example, the indium is fed with a flow rate IF into a process chamber in the form of a gas containing indium or a liquid containing indium. In the process chamber, for example, the semiconductor body 1 is grown epitaxially. Furthermore, the p-dopant is fed with a flow rate MF into the process chamber in which the semiconductor body 1 is being epitaxially grown. In particular, a different indium flow rate IF is adjusted during one of the time periods than during the other two time periods. In the present case, a different indium flow rate IF is adjusted during the second time period T2 than during the first time period T1 and the third time period T3. In particular, the flow rates of the p-dopant MF and of indium IF are not represented relative to one another in FIG. 4A.

During the first time period T1, the flow rate of the p-dopant MF is higher than during the second time period T2. For example, a flow rate of the p-dopant MF of 0 liters per second is adjusted during the second time period T2. Furthermore, the indium flow rate IF is lower during the first time period T1 than during the second time period T2. During the third time period T3, the flow rate of the p-dopant MF may be at least as great as the flow rate of the p-dopant MF during the second time period T2. During the third time period T3, the indium flow rate IF is lower than during the second time period T2. In particular, the indium flow rate IF during the third time period T3 is equally great as the indium flow rate IF during the first time period T1.

Figure 4B:
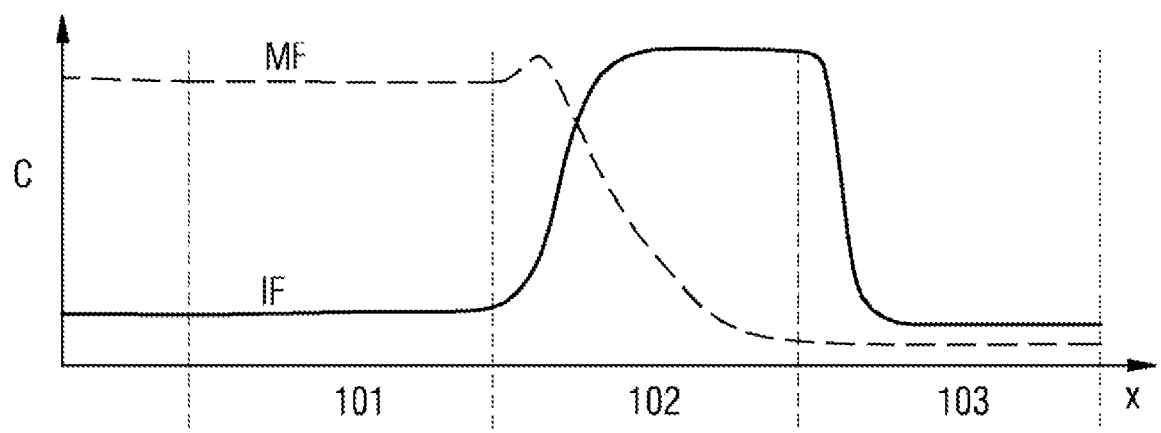
FIG. 4B and FIG. 5B show concentrations of the p-dopant and indium in a first, a second and a third section of a p-conductive region of a semiconductor body.

FIG. 4B shows by way of example the concentration of indium and of the p-dopant inside the first 101, the second 102 and the third 103 section, which are epitaxially grown during a first time period T1, a second time period T2 and a third time period T3.

In particular, the sections 101, 102, 103 of FIG. 4B have been grown in the time periods T1, T2, T3 represented in FIG. 4B. In the first section 101, the p-conductive region 10 has an almost constant concentration of indium I and of the p-dopant M. In the second section 102, the concentration of the p-dopant M initially increases in the growth direction X to a maximum value and subsequently falls below the value of the concentration of the p-dopant M in the first region 101. The increase in the concentration of the p-dopant M in the second section 102 is attributable to the fact that p-dopant M which has accumulated on the surface of the semiconductor body during the epitaxy method is incorporated better into the lattice structure of the semiconductor body with an increasing indium concentration I. During the second time period 102, more p-dopant M per unit time is incorporated in the semiconductor body 1 than is provided by means of the flow rate of the p-dopant MF during the second time period T2. The concentration of the p-dopant M therefore decreases in the growth direction X in the second section 102. In particular, the concentration of the p-dopant decreases at least with a maximum magnitude rate of change of $1\times10^{21}$ atoms per cm$^3$ per µm.

In the third section 103, the indium concentration I decreases in the growth direction X. For example, the indium concentration I falls a value which is at most equally high as the value in the first region 101. In regions in which the indium concentration I decreases in the growth direction X, concentration of the p-dopant M also decreases in the growth direction X.

Figure 5A:
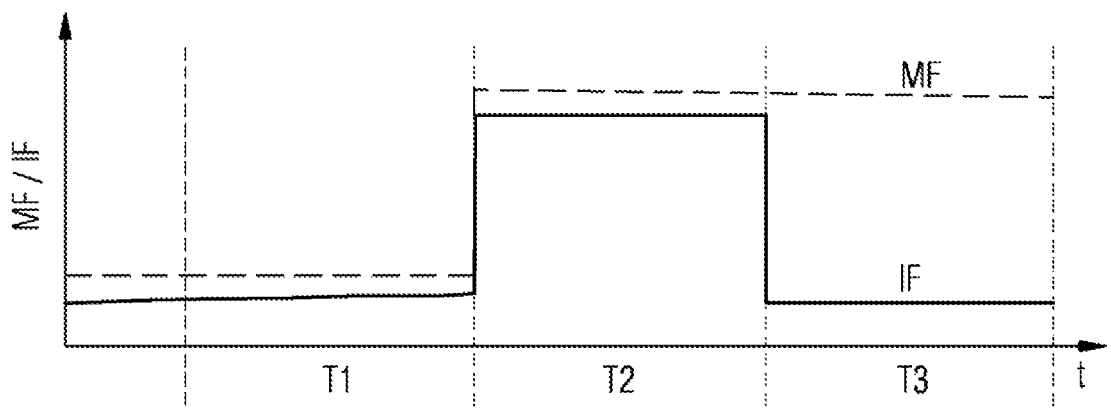

In a similar way to FIG. 4A, FIG. 5A shows a production method for producing a semiconductor body 1, during which a p-conductive region 10 having at least one first 101, one second 102 and one third 103 section is epitaxially grown. In this case, the first section 101 is grown during a first time period T1, the second section 102 is grown during a second time period T2 and the third section 103 is grown during a third time period T3. In contrast to the exemplary embodiment represented in FIG. 4A, a higher flow rate of the p-dopant MF and a higher flow rate of indium IF are adjusted during the second time period T2 than during the first time period T1. Furthermore, a lower indium flow rate IF is adjusted during the third time period T3 than during the second time period T2, and an at least equally high flow rate of the p-dopant MF is adjusted during the third time period T3 as during the second time period T2.

Figure 5B:
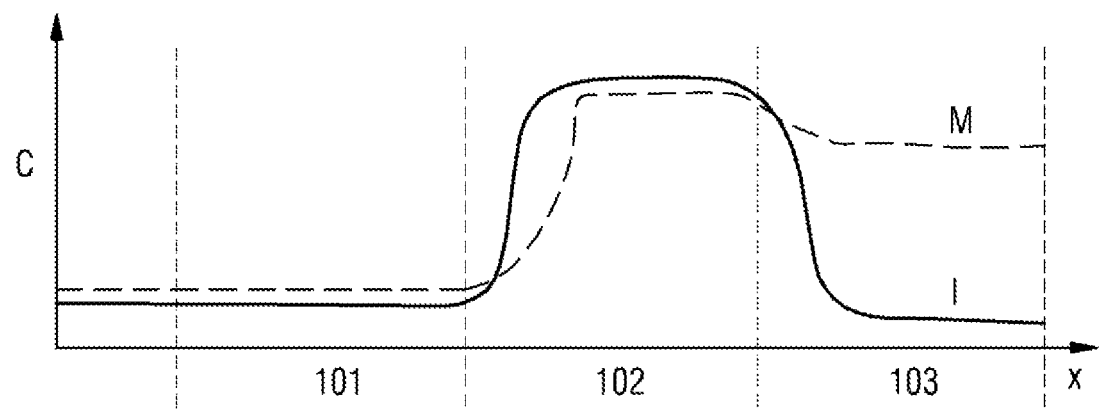

FIG. 5B shows the concentration C of a p-dopant M and indium I in a first 101, second 102 and third 103 section of a p-conductive region, which have been epitaxially grown during the first T1, the second T2 and the third T3 time periods that are represented in FIG. 5A. In the first section 101, the indium concentration I and the concentration of the p-dopant M are almost constant. In the second section 102, the indium concentration I increases in the growth direction X to a maximum value. The concentration C of the p-dopant M initially increases in the second section 102 with a low rate of change and subsequently with a high rate of change to a maximum value. In particular, the concentration of the p-dopant increases with a greater rate of change with an increasing indium content I. This is attributable to the fact that an increased indium content improves the incorporation of the p-dopant into the semiconductor body.

In the third section 103, the indium concentration I decreases in the growth direction X. For example, the indium concentration I in the third section 103 decreases in the growth direction X to a value which corresponds to the indium concentration I in the first section 101. The concentration C of the p-dopant M in the third section 103 decreases in the growth direction X. This is attributable to the fact that the incorporation of the p-dopant M into the semiconductor body 1 becomes more difficult with a decreasing indium concentration I. The p-dopant M therefore accumulates more on the surface of the semiconductor body 1 during the epitaxial growth of the third section 103. The incorporation of the p-dopant M in the third section 103 decreases with decreasing indium concentration I.

The description with the aid of the exemplary embodiments does not restrict the invention to said exemplary embodiments. Rather, the invention includes any new feature and any combination of features, which includes in particular any combination of features in the patent claims, even if this feature or this combination per se is not explicitly indicated in the patent claims or exemplary embodiments.

LIST OF REFERENCES 1 semiconductor body
10 p-conductive region
10a side of the p-conductive region facing toward the active region
10c side of the p-conductive region facing away from the active region
20 active region
30 n-conductive region
50 carrier
11 electron blocking layer
12 p-contact layer
I indium
M p-dopant
C concentration
101 first section
101' further first section
102 second section
102' further second section
103 third section
103' further third section
T1 first time period
T2 second time period
T3 third time period
X growth direction

The invention claimed is:

1. A semiconductor body comprising a III-V compound semiconductor material; wherein the semiconductor body comprises:
   a p-conductive region doped with a p-dopant, wherein the p-conductive region comprises at least one first section, at least one second section, and at least one third section;
   wherein the second section is arranged between the first section and the third section;
   wherein the second section is directly adjacent to the first and the third sections;
   wherein an indium concentration of the second section is higher than the indium concentrations of both of the other two sections; wherein the indium concentration of the second section is at least $1 \times 10^{18}$ atoms per $cm^3$ and wherein the first section, the second section, and the third section have different concentrations of the p-dopant.

2. The semiconductor body as claimed in claim 1, wherein the second section has a higher concentration of the p-dopant than the first section.

3. The semiconductor body as claimed in claim 1, wherein at least the first section or the third section has an indium concentration of at least $1 \times 10^{17}$ atoms per $cm^3$.

4. The semiconductor body as claimed in claim 1, wherein the second section has a higher concentration of the p-dopant than the third section.

5. The semiconductor body as claimed in claim 4, wherein the concentration of the p-dopant in the second section has a local maximum.

6. The semiconductor body as claimed in claim 1, wherein the concentration of the p-dopant in the p-conductive region has a rate of change of at least $\pm 1E+21$ atoms/$cm^3$/$\mu m$ perpendicularly to a main extent plane of the first section, the second section, and the third section.

7. The semiconductor body as claimed in claim 1, further comprising an active region, wherein the p-conductive region comprises an electron blocking layer;
   wherein the electron blocking layer is present on a side of the p-conductive region facing toward the active region;
   wherein the first section and/or the second section lie at least partially inside the electron blocking layer;
   wherein the first section is adjacent to the active region and the third section is adjacent to the second section; and
   wherein the first section and/or the second section have a higher concentration of the p-dopant than the active region adjacent to the electron blocking layer and the third section adjacent to the second section.

8. The semiconductor body as claimed in claim 1, further comprising an active region; wherein the p-conductive region comprises a p-contact layer;
   wherein the p-contact layer is present on a side of the p-conductive region facing away from the active region; and
   the second section lies at least partially inside the p-contact layer.

9. The semiconductor body as claimed in claim 1, wherein the p-dopant comprises magnesium.

10. A semiconductor body comprising a III-V compound semiconductor material; wherein the semiconductor body comprises:
    an active region; and a p-conductive region doped with a p-dopant, wherein the p-conductive region comprises at least one first section, at least one second section, and at least one third section;

wherein the at least one second section is arranged between the at least one first section and the at least one third section;

wherein the at least one second section is directly adjacent to the at least one first section and to the at least one third section;

wherein the at least one first section is directly adjacent to the active region;

wherein the at least one first section, the at least one second section and the at least one third section have different concentrations of the p-dopant;

wherein an indium concentration of at least one of the at least one first section, the at least one second section, and the at least one third section is different to the indium concentration of the other sections;

wherein the at least one second section has a higher indium concentration than the at least one first section;

wherein the at least one second section has a higher p-dopant concentration than the at least one first section; and wherein the at least one third section has a lower p-dopant concentration than the at least one first section.

* * * * *